US006635822B2

(12) United States Patent
Krupa, Jr.

(10) Patent No.: US 6,635,822 B2
(45) Date of Patent: Oct. 21, 2003

(54) SNAP-IN METER

(75) Inventor: Robert L. Krupa, Jr., Parma Heights, OH (US)

(73) Assignee: Prime Instruments, Inc., Cleveland, OH (US)

( * ) Notice: Subject to any disclaimer, the term of this patent is extended or adjusted under 35 U.S.C. 154(b) by 0 days.

(21) Appl. No.: 10/071,852

(22) Filed: Feb. 7, 2002

(65) Prior Publication Data

US 2002/0104672 A1 Aug. 8, 2002

Related U.S. Application Data

(60) Provisional application No. 60/267,752, filed on Feb. 8, 2001.

(51) Int. Cl.[7] ................................................. H01H 9/02
(52) U.S. Cl. ........................... 174/58; 174/50; 174/63; 220/4.02; 248/906; 439/535
(58) Field of Search .................. 174/58, 50, 63, 174/17 R, 53; 220/4.02, 3.2, 3.9; 248/906; 439/535

(56) References Cited

U.S. PATENT DOCUMENTS

| 4,646,007 | A |   | 2/1987  | Faria           |            |
|-----------|---|---|---------|-----------------|------------|
| 4,710,706 | A |   | 12/1987 | Krupa, Jr.      |            |
| 4,880,387 | A | * | 11/1989 | Stikeleather et al. | 174/65 R X |
| 5,775,482 | A |   | 7/1998  | Wolfe et al.    |            |
| 6,127,630 | A | * | 10/2000 | McKenzie et al. | 248/906 X  |
| 6,191,362 | B1 | * | 2/2001 | Gretz           | 174/58     |
| 6,207,895 | B1 | * | 3/2002 | Engel           | 174/53     |
| 6,369,322 | B1 | * | 4/2002 | Gretz           | 174/58 X   |
| 6,403,883 | B1 | * | 6/2002 | Morgan et al.   | 174/58     |
| 6,452,097 | B1 | * | 9/2002 | DeWall          | 174/58     |

OTHER PUBLICATIONS

Prime Analog Panel Meters, Catalog No. 191, F–1057, Rev. Jan. 1992.

\* cited by examiner

*Primary Examiner*—Dean A. Reichard
*Assistant Examiner*—Dhiru R Patel
(74) *Attorney, Agent, or Firm*—Renner, Otto, Boisselle & Sklar, LLP

(57) ABSTRACT

A housing for a meter is disclosed. The housing includes a base portion which has an insertion axis along which the base portion can be inserted into an opening in a panel and an interior space for receiving electrical meter components. A flange extends laterally outwardly from the base portion and one or more resiliently flexible flaps extend from the base portion and are free to flex laterally inwardly about an axis generally parallel to the insertion axis and towards the base portion to permit passage of the flap or flaps through the panel opening when the base portion is inserted into the panel opening. The flap has a panel abutting surface that is axially spaced from the flange and at least partially laterally coextensive with the flange to define therebetween a slot or gap for receiving a portion of the panel adjacent the panel opening. The flap can return at least partially to its original unflexed condition, positioning the panel abutting surface beneath the panel for engagement with the bottom surface of the panel, for holding the housing to the panel.

8 Claims, 5 Drawing Sheets

SNAP-IN METER

This application claims the benefit of Provisional Application No. 60/267,752, filed Feb. 8, 2001, which is hereby incorporated herein by reference in its entirety.

FIELD OF THE INVENTION

The present invention relates to a meter housing and, more particularly, a meter housing including one or more resiliently flexible flaps which maintain the meter housing in abutting relation with a panel having an opening into which the meter housing is installed.

BACKGROUND

Various means heretofore have been used for mounting a housing for a meter, switch or other component in a panel opening. For example, a rectangular shape snap-in housing has been provided with integrally molded spring clips that extend from the housing side walls in a direction parallel to the direction of insertion of the housing into a panel opening. As the housing is inserted from the front of the panel into a correspondingly sized rectangular panel opening, the clips are engaged by the side edges of the opening and caused to flex inward. When the housing has been fully inserted into the opening by bringing a flange of the housing into contact with the front face of the panel, the clips spring outwardly and abut a rear side of the panel to hold the housing in place. The housings with these spring clips require relatively complicated molds, i.e., the housings cannot be molded in simple two-part molds. In addition, these spring clips cannot tolerate a wide range of panel thicknesses while still providing a tight and secure mounting of the housing in the panel. Also, these spring clips have only been used with rectangular housings.

Another mounting technique has been to use U-shaped clamps which are fastened against the backside of the panel by nuts on threaded posts. This mounting technique can accommodate a wide range of panel thicknesses while providing a tight and secure mounting. Also, the mounting technique can be used with round housings. However, the clamps must be assembled from the rear side of the panel which is not always desirable, and the assembly process is relatively time consuming and tedious relative to a simple snap-in (push-in) mounting technique.

Consequently, a need exists for a housing-panel mounting technique that overcomes one or more of the drawbacks associated with known housing-panel mounting techniques and/or provides one or more advantages heretofore not attainable by known housing-panel mounting techniques.

SUMMARY OF THE INVENTION

The present invention provides a snap-in-place housing for a meter or the like. The housing has one or more resilient flaps which flex inwardly to permit insertion into an opening in a panel and then flex outwardly for engaging a rear side of a panel to hold the meter housing to the panel. In contrast to the prior art clips which rotate about an axis generally perpendicular to the insertion direction of the housing, the flaps according to the present invention rotate about an axis generally parallel to the insertion direction. As is preferred, the flap or flaps may include one or more steps on panel abutting edges thereof for accommodating different thickness panels.

The present invention has particular application to round meter housings. According to this aspect of the invention, a meter housing includes a round base portion, a flange (annularly continuous or discontinuous) extending radially outwardly from the round base portion, and at least one resiliently flexible flap extending tangentially from the round base portion. The flap or flaps are free to flex radially inwardly towards the base portion to permit passage of the flap or flaps through an opening in a panel when the base portion is inserted into the panel opening. The flap or flaps have a panel abutting surface that is axially spaced from the flange and at least partially radially coextensive with the flange to define therebetween a slot or gap for receiving a portion of the panel adjacent the panel opening. The slot or gap allows the flap or flaps to return at least partially to their original unflexed condition, positioning the panel abutting surface beneath the panel for engagement with the bottom surface of the panel, thereby holding the housing to the panel.

In a preferred embodiment, the flap or flaps have a stepped edge surface facing the flange, the axial spacing between the tread portion of each step and the flange decreasing going from the radially outermost step to the radially innermost step. The tread portion of each step defines a respective panel abutting surface for abutting the bottom side of the panel. Accordingly, the gaps formed between the respective steps progressively decrease in axial dimension going from the outside to the inside step, thereby allowing for snug capture of panels having different thickness. As a result, the housing can accommodate different panel thicknesses while still tightly holding the housing to the panel.

In a preferred embodiment, the base portion has a radially outer side surface corresponding to the shape of the panel opening into which it is to be inserted. The radially outer side surface is interrupted by one or more recesses for receiving the one or more flaps, respectively. The recesses have a depth sufficient to permit the flap or flaps to flex radially inwardly and within the envelope defined by the radially outer surface of the base portion, thereby enabling passage of the flap or flaps through the panel opening when the base portion is inserted into the panel opening.

In a preferred embodiment, four flaps are provided on a base portion that is circular in cross-section. The flaps are arranged in pairs on diametrically opposite sides of the base portion with the flaps in each pair extending in opposite tangential directions. Preferably the flaps are symmetrically disposed. Also, the flaps of each pair extend from a rib that separates the flap recesses and forms a part of the radially outer side surface of the base portion to assist in guiding and maintaining the housing centrally disposed within the panel opening when inserted therein.

The present invention also has application to meter housings having other than round base portions, including meter housing having rectangular shaped base portions. In this context, the radial direction means a lateral direction transverse to the insertion axis of the meter housing, and tangential means at an angle to a side wall of the base portion which provides for flexing of the resilient flap about an axis generally parallel to the insertion axis of the housing. Thus, according to this more general aspect of the invention, a meter housing includes a base portion having an insertion axis along which the base portion can be inserted into an opening in a panel and an interior space for receiving electrical meter components, a flange (continuous or discontinuous) extending laterally outwardly from the base portion, and at least one resiliently flexible flap extending from the base portion. The flap or flaps are free to flex laterally inwardly about an axis generally parallel to the insertion axis and towards the base portion to permit passage of the flap or flaps through the panel opening when the base portion is inserted into the panel opening. The flap or flaps have a panel abutting surface that is axially spaced from the flange and at least partially laterally coextensive with the flange to define therebetween a slot or gap for receiving a portion of the panel adjacent the panel opening. The slot or gap allows the flap or flaps to return at least partially to their original unflexed condition, positioning the panel abutting surface beneath the panel for engagement with the bottom surface of the panel, thereby holding the housing to the panel.

The foregoing and other features of the invention are hereinafter fully described and particularly pointed out in the claims, the following description and the annexed drawings setting forth in detail one or more illustrative embodiments of the invention, such being indicative, however, of but one or a few of the various ways in which the principles of the invention may be employed.

DETAILED DESCRIPTION

Figure 1:
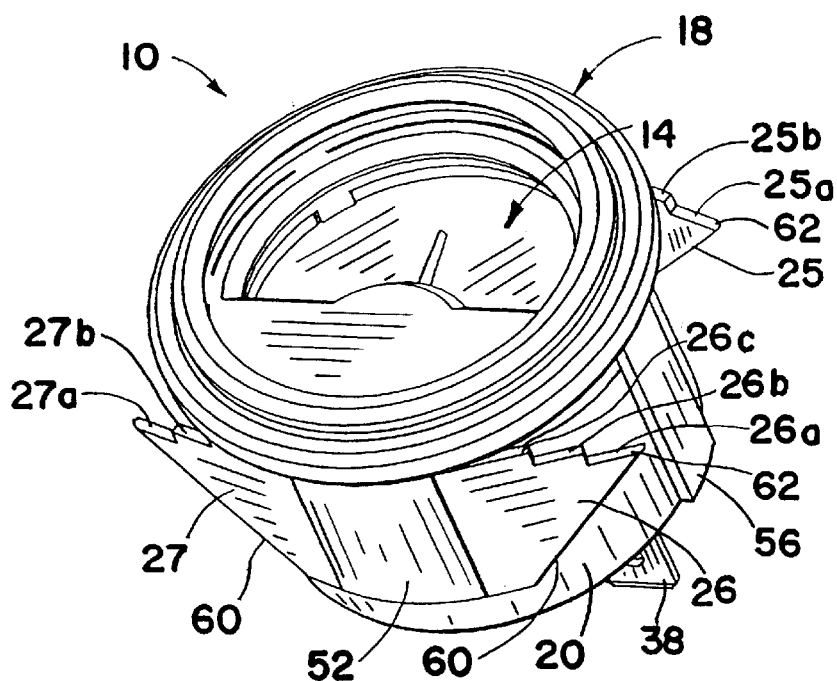
FIG. 1 is a perspective view of a meter apparatus embodying a meter housing in accordance with the present invention.

Referring now in detail to the drawings and initially to FIGS. 1–4, a meter apparatus is indicated generally at 10. The meter apparatus 10 includes a meter housing 12, an electrical measuring meter 14 contained within the housing 12, and a cover 18 attached to the housing 12 to protect the meter 14 from damage, dirt, water or the like. The meter housing 12 generally comprises a base portion 20, one or more resilient flaps (four flaps 24–27 in the illustrated embodiment) and a flange 32.

The base portion 20 preferably is round and has a rear (bottom) wall 34 and an annular side wall 35. The rear wall 34 may include a pair of slot-like openings 36 through which conductive tabs 38 of the electric meter 14 can pass for connection of the meter 14 in an electrical circuit. The side wall 35 preferably has a cylindrical outer surface 37 for fitting in a circular opening in a panel in the manner hereinafter described. The outer wall surface 37 is interrupted by one or more recesses 44, 45, 46 and 47 for receiving the one or more flaps 24, 25, 26 and 27, respectively. The recesses 44–47 preferably have a depth sufficient to permit the flap or flaps 25–27 to flex radially inwardly and within the envelope defined by the radially outer surface 37 of the base portion 20, thereby enabling passage of the flap or flaps 25–27 through a panel opening when the base portion 20 is inserted into the panel opening. In the illustrated embodiment, the depth of each recess 44–47 is about equal the thickness of the respective flap 24–27.

The flaps 24–27 preferably extend substantially tangentially from the base portion 20. For a round housing, the four flaps 24–27 preferably are arranged in pairs on diametrically opposite sides of the base portion 20 with the flaps 24–27 in each pair (flaps 24, 25 and flaps 26, 27) extending in generally opposite tangential directions. Preferably, the flaps 24–27 are symmetrically disposed. Also, the flaps 24, 25 and flaps 26, 27 extend from respective ribs 50, 52 that separate the respective flap recesses 44, 45 and recesses 46, 47 and form a part of the radially outer side surface 37 of the base portion 20 to assist in guiding and maintaining the housing 12 centrally disposed within a panel opening when inserted therein. A smaller set of diametrically opposed ribs 54, 56 are circumferentially offset from and provide a similar function as the ribs 50, 52. One of the ribs 54 (the left rib 54 in FIGS. 2 and 3) may include a key 58 which, when lined up with a key slot (not shown) at the edge of a panel opening, ensures proper registry of the housing 12 relative to the panel.

As is preferred, each flap 24–27 is generally triangular in shape having an inclined rear edge 60 and a panel abutting edge 62. As discussed further below, the inclined rear edge 60 functions like a cam for engaging the edge of a panel opening as the housing 12 is being inserted into the opening to effect gradual radially inward movement of the flap 24–27 towards and into the respective recess 44–47 in the housing 12. The inclined rear edges 60 may have the outer corners thereof chamfered, as indicated at 64, to further facilitate smooth insertion.

The panel abutting edge 62 is axially spaced from the flange 32 and at least partially radially coextensive with the flange 32 to define therebetween a slot or gap for receiving a portion of the panel adjacent the panel opening. The slot or gap allows the flap 24–27 to return at least partially to its original unflexed condition, positioning the panel abutting edge 62 beneath the panel for engagement with the bottom surface of the panel, for holding the housing 12 to the panel.

For accommodating different panel thicknesses, the panel abutting edge 62 of each flap 24–27 is stepped such that the treads 24a–c, 25a–c, 26a–c, 27-a–c of the steps are at different axial spacings from the flange 32. The axial spacing between the step treads and the flange 32 decreases going from the radially outermost step 24a, 25a, 26a, 27a to the radially innermost step 24c, 25c, 26c, 27c. The tread portion of each step defines a respective panel abutting surface for abutting the bottom side of the panel. Accordingly, the gaps formed between the respective steps progressively decrease in axial dimension going from the outermost step 24a, 25a, 26a, 27a to the innermost step 24c, 25c, 26c, 27c, thereby allowing for snug capture of panels having different thickness. As a result, the housing 12 can accommodate different panel thicknesses while still tightly holding the housing 12 to the panel with the panel tightly captured between the flaps 24–27 and the flange 32.

The flange 32, which extends laterally outwardly from the top edge of the base portion 20, may be annularly continuous as is preferred or may be discontinuous, i.e., interrupted.

That is, the flange 32 may be comprised of a plurality of circumferentially spaced apart flange segments, if desired. The flange 32 has a larger overall width dimension than that of the base portion 20 to enable the flange 32, and more particularly an underside 80 thereof (FIGS. 2, 5–6, 7, 9), to abut an upper surface of a panel adjacent an opening into which the base portion 20 is to be inserted.

The meter housing 12, flaps 24–27 and flange 32 preferably are formed as a unitary piece and preferably by molding from plastic. As will be appreciated, the use of resilient flaps that flex about an axis parallel to the insertion axis of the housing enables injection molding of the housing, for example from nylon, using a two directional mold with cams.

Figure 2:
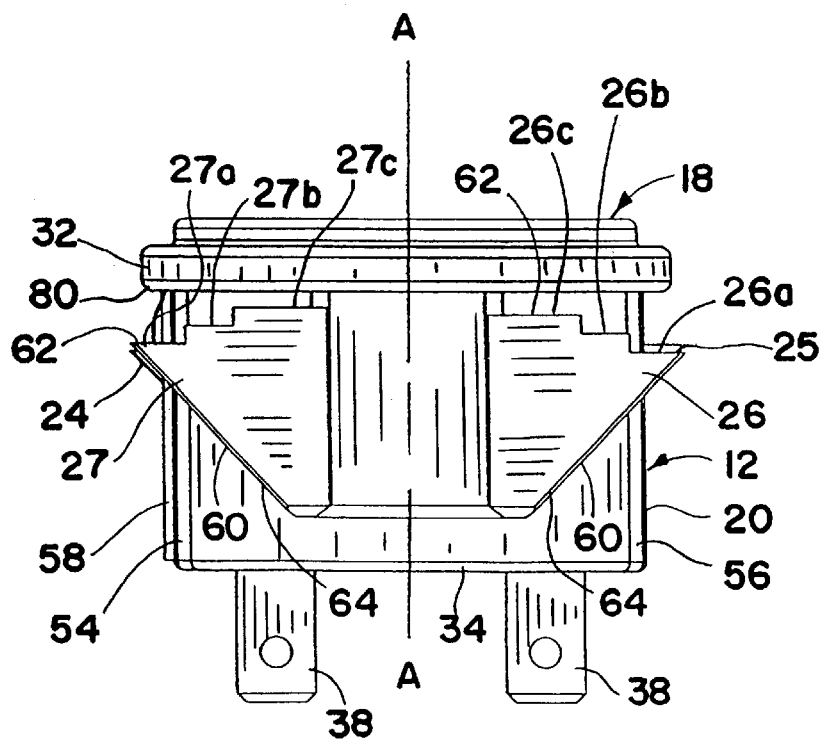
FIG. 2 is a side elevational view of the FIG. 1 meter apparatus.
Figure 3:
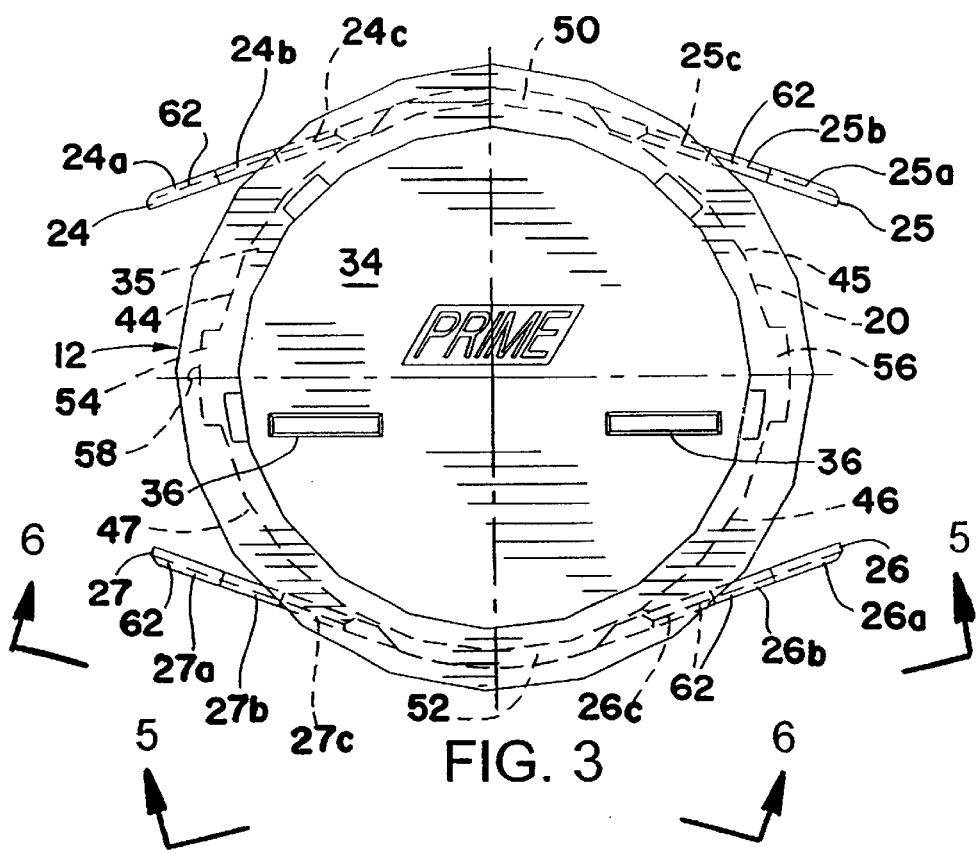
FIG. 3 is a front view of the meter housing according to the present invention.
Figure 4:
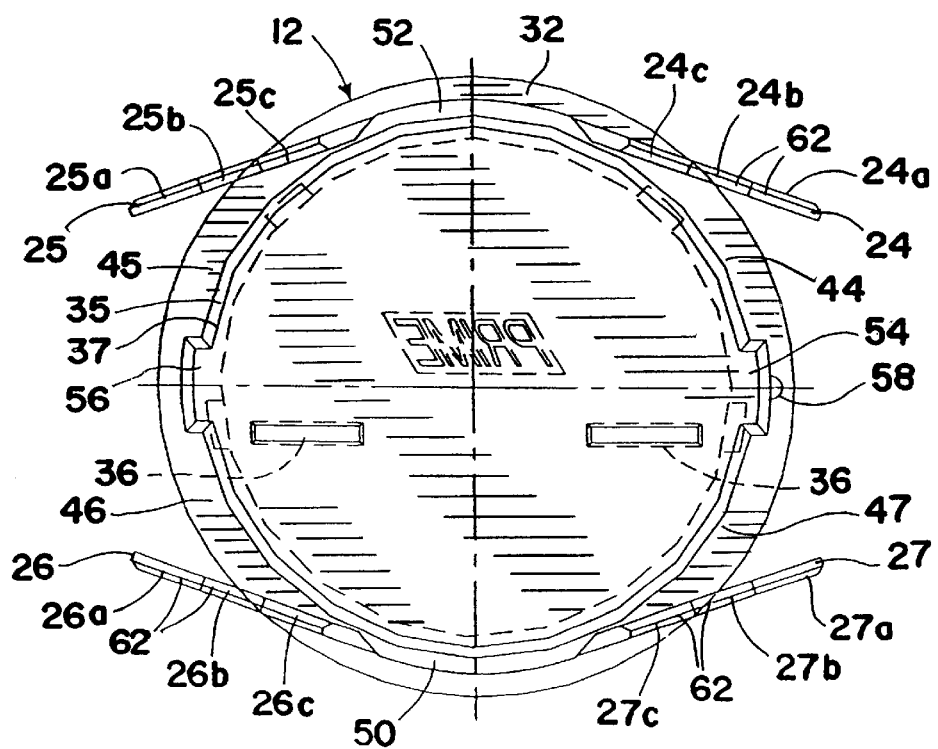
FIG. 4 is a rear view of the meter housing according to the present invention.

The cover 18 may be formed separately from the housing 12 and attached to the flange 32 or otherwise to the housing 12. As is shown in FIG. 2, the cover 18 may be crimped over the flange 32 around its entire circumference. Thus, in the illustrated embodiment, a portion of the cover 18 extends over the underside 80 of the flange 32 and when the base portion 20 is inserted into an opening, will abut the upper surface of the panel rather than the flange 32 itself. In view of this, it should be understood that the term "flange" is herein meant to encompass the structure that extends radially (laterally) outwardly of the base portion 20 of the housing 12 for engaging the front side of the panel for coacting with the flaps 24–27 to hold the meter housing 12 to the panel.

Figure 5:
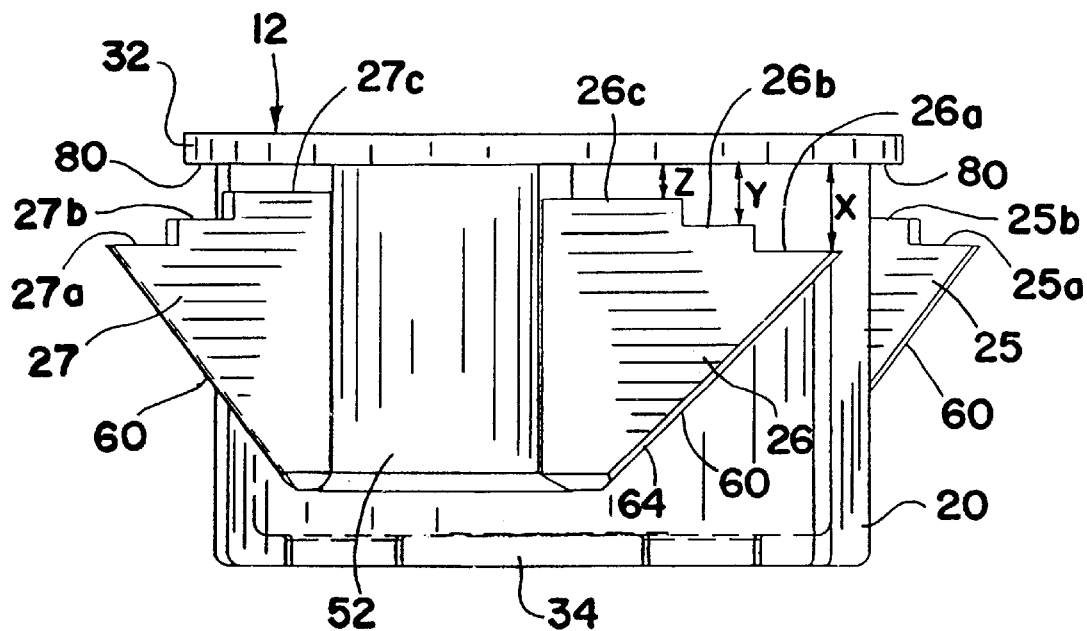
FIG. 5 is a side elevational view of the meter housing as seen from the plane 5—5 in FIG. 3.
Figure 6:
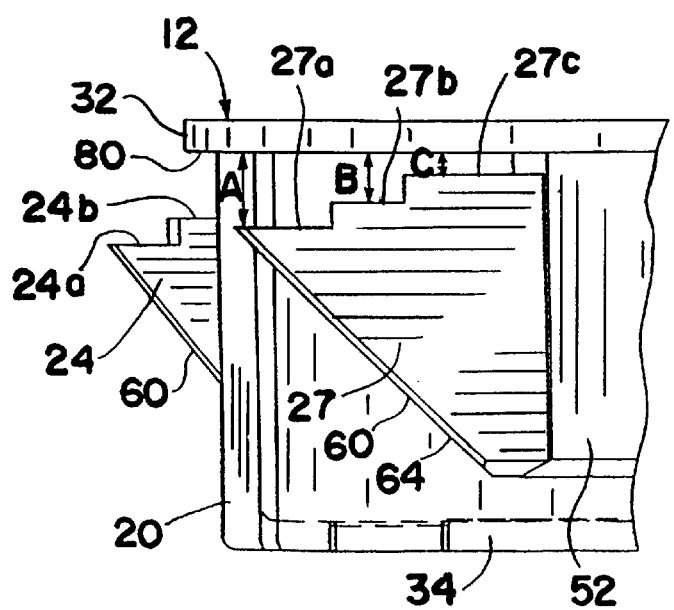
FIG. 6 is a fragmentary side elevational view of the meter housing as seen from the plane 6—6 in FIG. 3.

In FIGS. 5 and 6, the stepped edges 24a–c, 25a–c, 26a–c, 27a–c of the flaps 24–27 are shown in greater detail. The spaces between the tread portions 26a–c, and 27a–c and the underside 80 of the flange 32 form, respectively, six different size gaps X, Y, Z, A, B and C. It will be recognized that the gaps progressively decrease in size in the following order: X (largest), A, Y, B, Z and C (smallest).

In the illustrated embodiment, flap 24 has the same dimensions as its diametrically opposed flap 26. Accordingly, its tread portions 24a, 24b, 24c also form gaps X, Y, Z with the underside 80 of the flange 32. Similarly, the flap 25 has the same dimensions as its diametrically opposed flap 27 and thus its tread portions 25a, 25b, 25c also form gaps A, B, C with the underside 80 of the flange 32. In accordance with the invention, the six different size gaps X, Y, Z, A, B and C formed by the flaps 24, 25, 26 and 27 and the flange 32 function to accommodate six different thickness panels having thicknesses corresponding to the heights of the gaps X, Y, Z, A, B and C.

Figure 7:
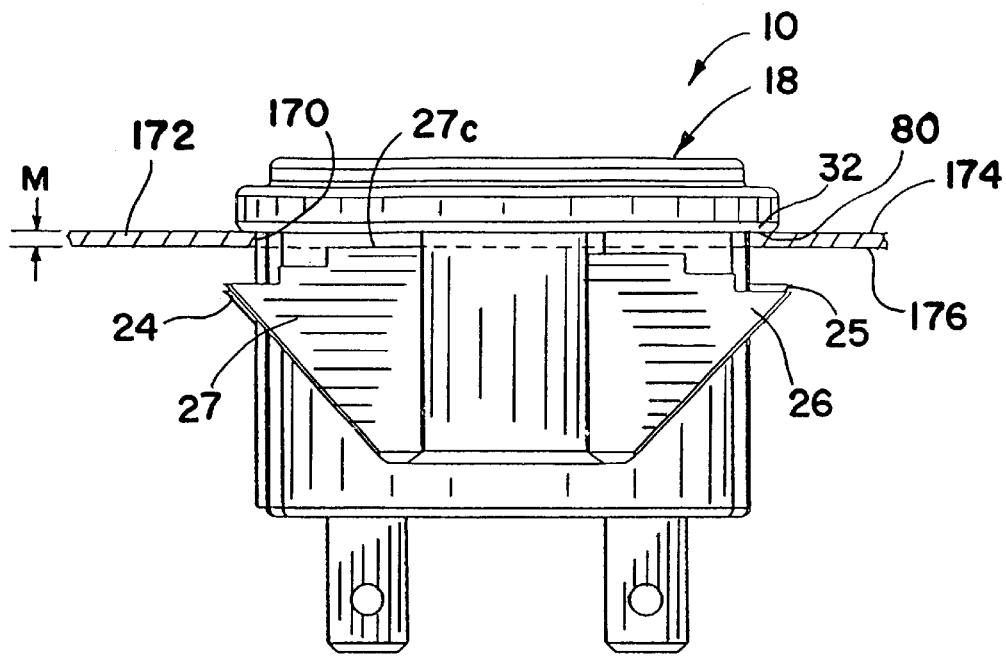
FIG. 7 is a side elevational view of the meter housing shown installed in a panel, the panel being shown in cross section.
Figure 8:
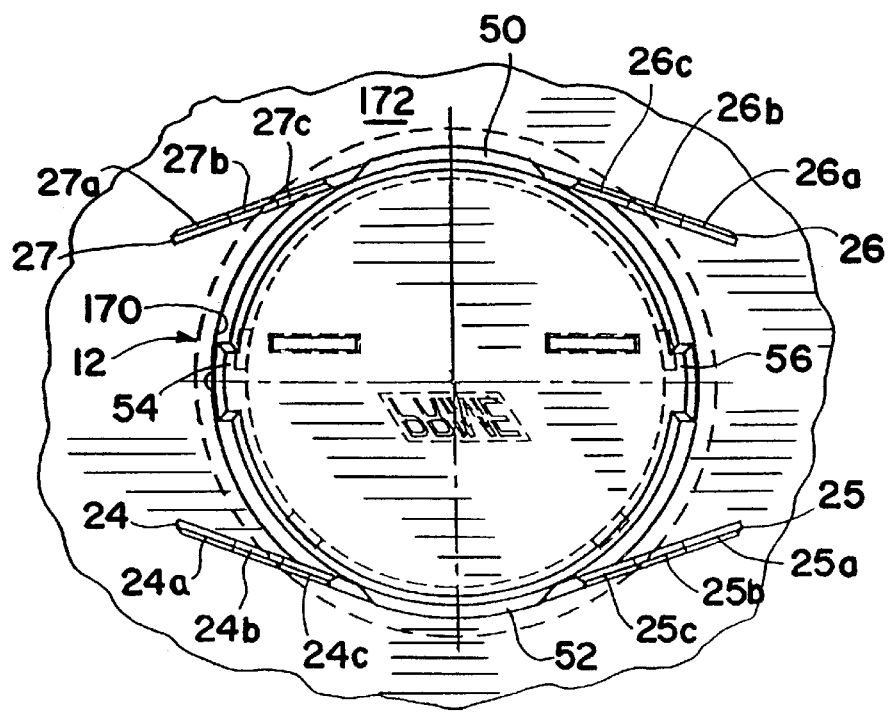
FIG. 8 is a rear view of the meter housing and panel installation of FIG. 7.

For example, referring to FIGS. 7 and 8, the meter housing 12 is shown installed in an opening 170 of a panel 172 having a thickness M corresponding to the height of the gap C, i.e., the smallest gap formed between any of the tread portions and the underside 80 of the flange 32. Here, all of the flaps 24, 25, 26 and 27 can spring back to their original unflexed positions (FIGS. 3 and 4) after insertion through the panel opening. As is shown in FIG. 7, the meter housing 12, and thus the meter apparatus 10, is maintained in abutting relation with the panel 172 by the flange 32 abutting the panel 172 on a top side 174 thereof and the tread portions 25c and 27c of the respective flaps 25 and 27 abutting a bottom side 176 thereof. Also, as is most clearly shown in FIG. 8, the diametrically opposed ribs 50, 52, 54 and 56 are in abutting relation with the circumferential edge of the opening 170 to substantially prevent lateral movement of the meter housing 12 within the opening 170 of the panel 172.

It will be appreciated that in some instances the flange 32 or the tread portions 25c and 27c may not be in abutting relation with the panel 172 due to, for example, the tolerances of the respective components being relatively large so as to cause a gap to form therebetween. Similarly, while in the illustrated embodiment the ribs 50, 52, 54 and 56 are shown to be in abutting relation with the circumferential edge of the opening 170, in some instances the tolerances of the ribs 50, 52, 54 and 56 may cause a clearance to form therebetween.

Figure 9:
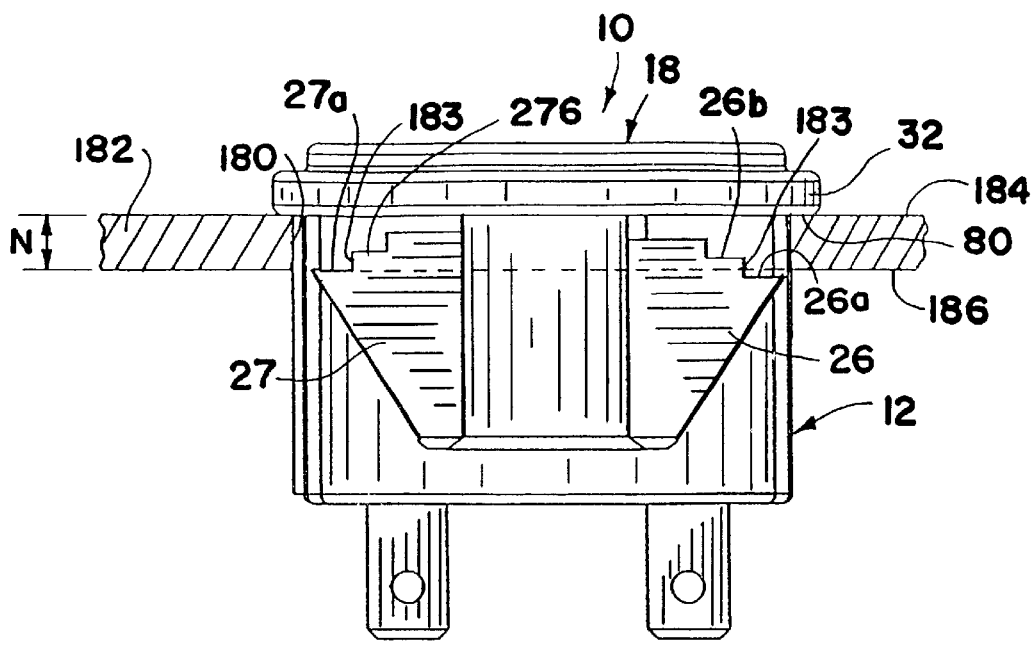
FIG. 9 is a side elevational view of the meter housing similar to FIG. 7, but showing the meter housing installed in a panel having a different thickness.
Figure 10:
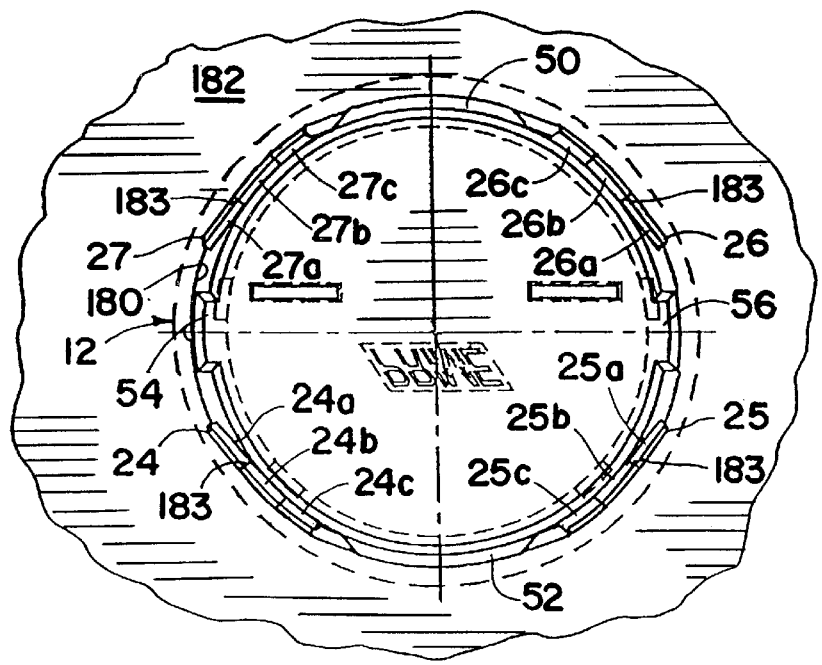
FIG. 10 is a rear view of the meter housing and panel installation of FIG. 9.

Referring to FIGS. 9 and 10, the meter housing 12 is shown installed in an opening 180 of a panel 182 having a thickness N corresponding to the height of the gap A. Here, the flaps 24, 25, 26 and 27 will spring back away from the base portion 20 until the riser portions 183 between the respective tread portions 24a, 25a, 26a, 27a and tread portions 24b, 25b, 26b, 27b engage the circumferential edge of the opening 180. More particularly, only the treads 24a, 25a, 26a and 27a of the respective flaps 24, 25, 26 and 27 will project outwardly away from the base portion 20 while the treads 24b–c, 25b–c, 26b–c and 27b–c of the flaps 24, 25, 26 and 27 will be held adjacent the base portion 20 by the edge of the panel opening. The meter housing 12 is maintained in abutting relation with the panel 182 by the flange 32 abutting the panel 182 on a top side 184 thereof and the tread portions 25a (not shown in FIG. 9) and 27a of the respective flaps 25 and 27 abutting the panel 182 on a bottom side 186 thereof. As with the previous example in regard to the panel 172, the diametrically opposed ribs 50, 52, 54 and 56 are in abutting relation with the circumferential edge of the opening 180. The ribs 50, 52, 54 and 56, together with the engaging riser portions 183, substantially prevent lateral movement of the meter housing 12 within the opening 180 of the panel 182.

In view of the foregoing, it will be appreciated that the degree to which the flaps 24, 25, 26 and 27 flex laterally away from the base portion 20 after being installed into an opening of a panel will depend on the thickness of the panel. In some instances, all of the flaps 24, 25, 26 and 27 will flex away from the base portion 20 and return to their unflexed positions (FIGS. 7 and 8). In other instances, all of the flaps 24, 25, 26 and 27 will flex only partially away from the base portion 20 and substantially the same amount (FIGS. 9 and 10). In still other instances, one pair of flaps 24 and 26 will flex further away from the base portion 20 than the other pair of flaps 25 and 27, for example, as would be the case for panel thicknesses corresponding to the heights of gaps X, Y and Z.

It is noted that the flaps 24, 25, 26 and 27 of the illustrated meter housing 12 have a substantially symmetrical construction. For this reason, opposing flaps 24 and 26 function in substantially the same manner for a particular panel thickness and opposing flaps 25 and 27 function in substantially the same manner for a particular panel thickness. Thus, the diametrically opposing flaps 25 and 27 abut the panel 172 on its bottom side 176 on diametrically opposite sides of the opening 170 and, similarly, the diametrically opposing flaps 24 and 26 abut the panel 182 on its bottom side 186 on diametrically opposite sides of the opening 180.

The present invention also contemplates a meter housing including a single tangentially extending flap which forms a gap with the underside of the flange to accommodate a panel having a thickness corresponding to the height of the gap. Such an embodiment may require closer tolerance between abutting portions of the meter housing and panel, as the panel is not abutted on diametrically opposite sides of the opening but rather only on one side. The single tangentially extending flap may be equipped with multiple steps to accommodate different thickness panels.

In still another embodiment of the invention, the meter housing may include four identical flaps being equally spaced apart and having substantially the same size and dimensions. In this embodiment, all of the flaps function in substantially the same manner for a particular panel thickness and abut the panel on its bottom side at four different portions of the opening substantially 90 degrees apart.

Although the invention has been shown and described with respect to certain preferred embodiments, equivalent alterations and modifications will occur to others skilled in the art upon reading and understanding this specification and the annexed drawings. In particular regard to the various functions performed by the above described integers (components, assemblies, devices, compositions, etc.), the terms (including a reference to a "means") used to describe such integers are intended to correspond, unless otherwise indicated, to any integer which performs the specified function of the described integer (i.e., that is functionally equivalent), even though not structurally equivalent to the disclosed structure which performs the function in the herein illustrated exemplary embodiment or embodiments of the invention. In addition, while a particular feature of the invention may have been described above with respect to only one of several illustrated embodiments, such feature may be combined with one or more other features of the other embodiments, as may be desired and advantageous for any given or particular application.

What is claimed is:

1. A housing for a meter comprising a round base portion; a flange extending radially outwardly from the round base portion; and at least one resiliently flexible flap extending tangentially from the round base portion, the flap being free to flex radially inwardly towards the base portion to permit passage of the flap through an opening in a panel when the base portion is inserted into the panel opening, and the flap having a panel abutting surface that is axially spaced from the flange and at least partially radially coextensive with the flange to define therebetween a slot for receiving a portion of the panel adjacent the panel opening, whereby the flap can return at least partially to its original unflexed condition, positioning the panel abutting surface beneath the panel for engagement with the bottom surface of the panel, for holding the housing to the panel.

2. A housing as set forth in claim 1, wherein the flap has a stepped edge surface facing the flange, the axial spacing between a tread portion of each step and the flange decreasing going from a radially outermost step to a radially innermost step, and the tread portion of each step defining a respective panel abutting surface for abutting a bottom side of said panel, whereby housing can accommodate different panel thicknesses.

3. A housing as set forth in claim 1, wherein the base portion has a radially outer side surface corresponding to a shape of the panel opening into which it is to be inserted, and the base portion includes a recess that interrupts the radially outer side surface for receiving the flap.

4. A housing as set forth in claim 3, wherein the recess in the base portion has a depth sufficient to permit the flap to flex radially inwardly and within an envelope defined by the radially outer side surface of the base portion, thereby enabling passage of the flap through the panel opening when the base portion is inserted into the panel opening.

5. A housing as set forth in claim 1, wherein the base portion is circular in cross-section and four flaps are provided on the base portion, the flaps being arranged in pairs on diametrically opposite sides of the base portion.

6. A housing as set forth in claim 5, wherein the flaps in each pair extend in opposite tangential directions and are symmetrically disposed with respect to a center axis of the base portion.

7. A housing as set forth in claim 6, wherein the flaps of each pair extend from a rib that separates the flap recesses, and a radially outer side surface of the rib forms a part of the radially outer side surface of the base portion to assist in guiding and maintaining the housing centrally disposed within the panel opening when inserted therein.

8. A housing for a meter comprising a base portion having an insertion axis along which the base portion can be inserted into an opening in a panel and an interior space for receiving electrical meter components; a flange extending laterally outwardly from the base portion; and at least one resiliently flexible flap extending from the base portion, the flap being free to flex laterally inwardly about an axis generally parallel to the insertion axis and towards the base portion to permit passage of said at least one resiliently flexible flap through the panel opening when the base portion is inserted into the panel opening, and the flap having a panel abutting surface that is axially spaced from the flange and at least partially laterally coextensive with the flange to define therebetween a slot or gap for receiving a portion of the panel adjacent the panel opening, whereby the flap can return at least partially to its original unflexed condition, positioning the panel abutting surface beneath the panel for engagement with the bottom surface of the panel, for holding the housing to the panel.

* * * * *